United States Patent
Kuttner

(10) Patent No.: US 9,531,399 B1
(45) Date of Patent: Dec. 27, 2016

(54) LINEARITY IMPROVEMENT FOR HIGH RESOLUTION RFDAC

(71) Applicant: Intel IP Corporation, Santa Clara, CA (US)

(72) Inventor: Franz Kuttner, St. Ulrich (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/861,216

(22) Filed: Sep. 22, 2015

(51) Int. Cl.
*H03M 1/06* (2006.01)
*H03M 1/00* (2006.01)
*H03M 1/68* (2006.01)
*H03M 7/16* (2006.01)

(52) U.S. Cl.
CPC .......... *H03M 1/0612* (2013.01); *H03M 1/002* (2013.01); *H03M 1/682* (2013.01); *H03M 7/165* (2013.01)

(58) Field of Classification Search
None
See application file for complete search history.

(56) References Cited

U.S. PATENT DOCUMENTS

| 8,836,559 B2 * | 9/2014 | Kuttner | H03M 1/66 341/144 |
| 2014/0146914 A1 * | 5/2014 | Kuttner | H03M 1/66 375/295 |

* cited by examiner

*Primary Examiner* — Howard Williams
(74) *Attorney, Agent, or Firm* — Eschweiler & Associates, LLC

(57) ABSTRACT

A digital to analog converter (DAC) circuit to convert a digital input signal to an analog output signal, wherein the digital input signal comprises a plurality of Least Significant Bits (LSBs) and a plurality of Most Significant Bits (LSBs). The DAC circuit comprises a line decoder configured to receive the plurality of LSBs of the digital input signal and configured to generate line information based thereon. The DAC circuit further comprises a column decoder configured to receive the plurality of MSBs of the digital input signal and configured to generate column information based thereon. Further, the DAC circuit comprises one or more source cells arranged in a plurality of rows and a plurality of columns, wherein the one or more source cells are configured to be selectively activated and consequently generate an individual output signal based on the line information and the column information respectively.

19 Claims, 7 Drawing Sheets

LINEARITY IMPROVEMENT FOR HIGH RESOLUTION RFDAC

FIELD

The present disclosure relates to Digital to Analog Converters and method to improve the linearity thereof.

BACKGROUND

Digital to Analog Converters (DACs) are used to convert a digital signal into an analog signal. The DACs have various performance characteristics such as resolution, power consumption, accuracy, maximum sampling rate and dynamic range.

In high resolution DACs, the Most Significant Bits (MSBs) are normally built in a thermometer coded way, since the differential linearity of the output significantly increases in the thermometer coded design. The Less Significant Bits (LSBs) are realized in a binary way, which suffer from bad differential linearity.

DETAILED DESCRIPTION

Figure 1:
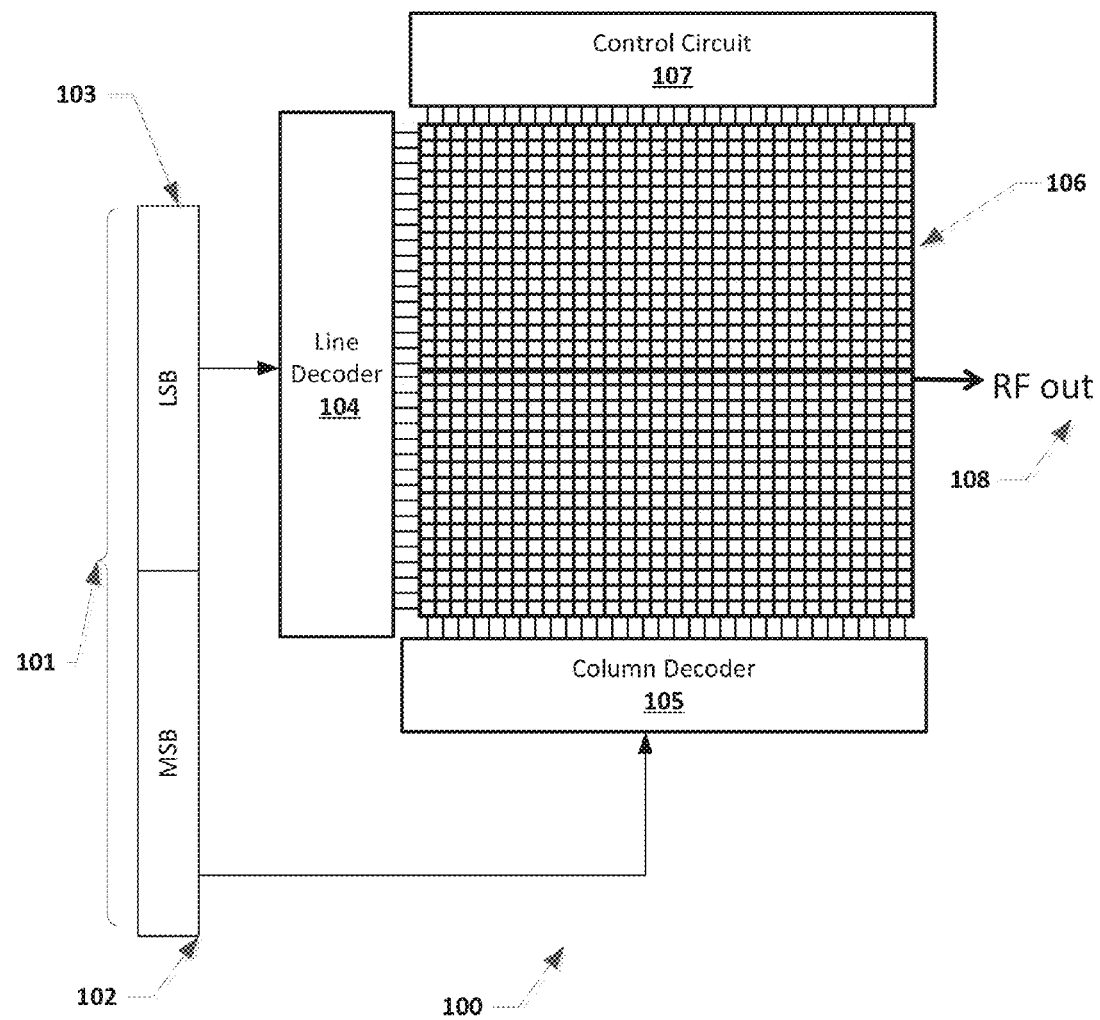
FIG. 1 illustrates a Digital to Analog Converter Circuit using Thermometer Coded Bits.

In the present disclosure, a digital to analog converter (DAC) circuit is disclosed. The digital to analog converter circuit converts a digital input signal to an analog output signal, wherein the digital input signal comprises a plurality of Least Significant Bits (LSBs) and a plurality of Most Significant Bits (MSBs). The digital to analog converter circuit comprises a line decoder configured to receive the plurality of LSBs of the digital input signal and configured to generate a line information based thereon. The DAC circuit further comprises a column decoder configured to receive the plurality of MSBs of the digital input signal and configured to generate a column information based thereon. The DAC circuit further comprises one or more source cells arranged in a plurality of rows and a plurality of columns, wherein the one or more source cells are configured to be selectively activated and consequently generate an individual output signal based on the line information and the column information respectively. Further, the DAC circuit comprises a control circuit configured to supply a source signal to the one or more source cells of the plurality of columns based on the column information.

The present disclosure will now be described with reference to the attached figures, wherein like reference numerals are used to refer to like elements throughout, and wherein the illustrated structures and devices are not necessarily drawn to scale. As utilized herein, terms "component," "system," "interface," "decoder" and the like are intended to refer to a computer-related entity, hardware, software (e.g., in execution), or firmware. For example, a component can be a processor, a process running on a processor, an object, an executable, a program, a storage device, an electronic circuit or a computer with a processing device. By way of illustration, an application running on a server and the server can also be a component. One or more components can reside within a process, and a component can be localized on one computer and/or distributed between two or more computers.

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure.

In addition, features of the different embodiments described hereinafter may be combined with each other, unless specifically noted otherwise.

While the methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

In order to obtain better differential linearity, thermometer coded bits are used in the DAC circuits. However, the amount of thermometer coded bits is limited by the binary to thermometer decoder. To increase the amount of thermometer coded bits, normally a structure of an array is used. The DAC circuit with an array structure comprises $2^N$ cells, wherein each cell comprises a local decoder controlled by a line information and a column information. As the number of thermometer coded bits increases, the resolution of the output analog signal of the DAC circuit increases.

FIG. 1 illustrates a DAC circuit 100. The DAC circuit 100 is configured to convert a digital input signal 101 to an analog output signal 108. The digital input signal 101 comprises a plurality of Least Significant Bits (LSBs) 103 and a plurality of Most Significant Bits (MSBs) 102. The DAC circuit 100 further comprises a line decoder 104, a column decoder 105, one or more source cells 106 and a control circuit 107.

The line decoder 104 is configured to receive the plurality of LSBs 103 of the digital input signal 101 and configured to generate a line information based thereon. The column decoder 105 is configured to receive the plurality of MSBs 104 of the digital input signal 101 and configured to generate a column information based thereon. The one or more source cells 106 are arranged in a plurality of rows and a plurality of columns. The one or more source cells are configured to be selectively activated and consequently generate an individual output signal based on the line information and the column information generated by the line decoder 104 and the column decoder 105 respectively.

In one embodiment, each of the one or more source cells 106 comprises a capacitor. The one or more source cells 106 are selectively activated by switching the respective capacitor.

Figure 2:
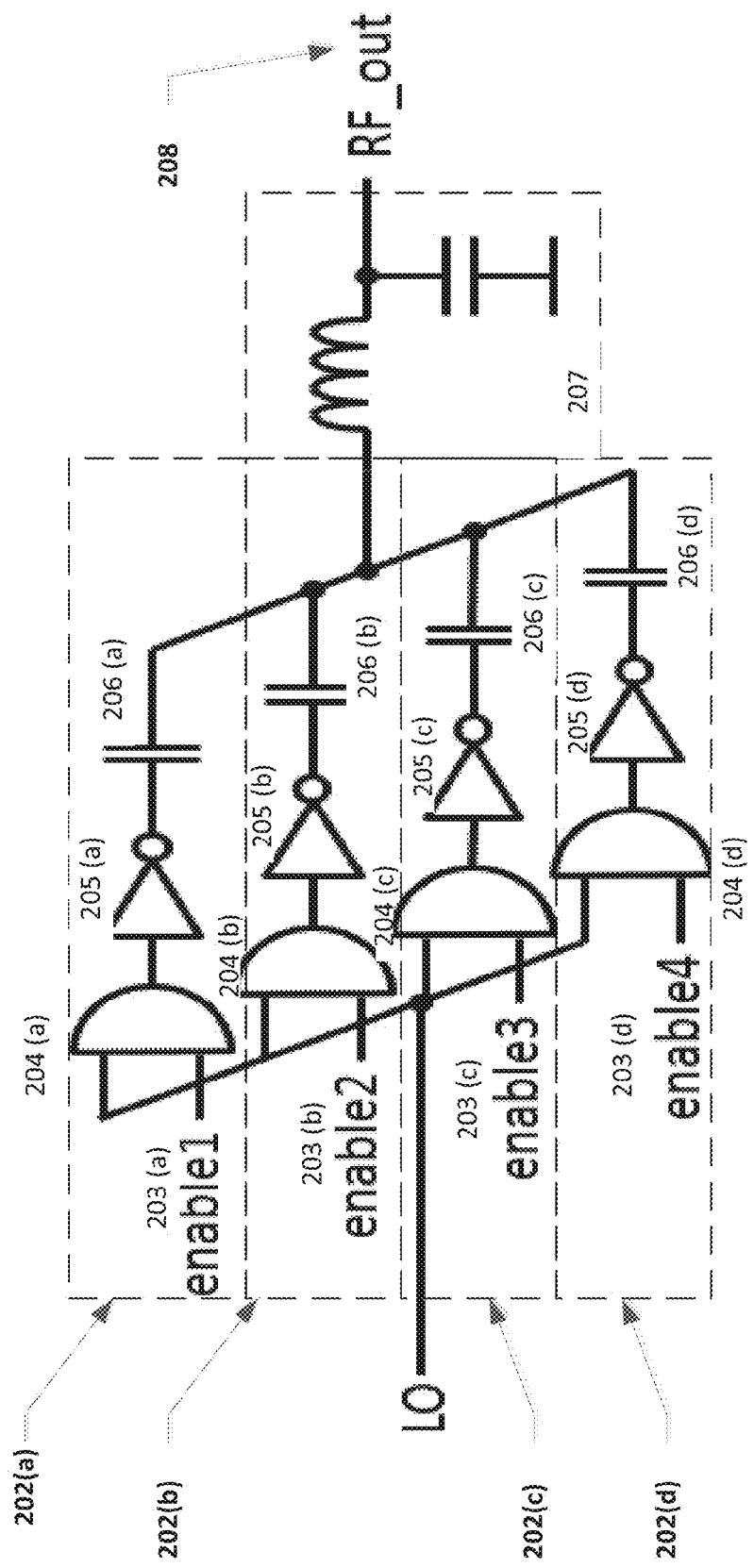
FIG. 2 illustrates the working of an array of source cells based on the column information.

FIG. 2 illustrates the switching of the capacitor based on the line information in a digital to analog converter circuit 200. The example in FIG. 2 has a Local Oscillator 201 which provides a clock to the one or more source cells. For simplicity, the illustration in FIG. 2 has four source cells 202(*a*)-202(*d*). The source cells 202(*a*)-202(*d*) have enable lines 203(*a*)-203(*d*), respectively; AND gates 204(*a*)-204(*d*), respectively; INVERTER gates 205(*a*)-205(*d*), respectively; and capacitors 206(*a*)-206(*d*), respectively. The cumulative output 208 of the capacitors 206(*a*)-206(*d*) is obtained through the load 207.

The LO 201 provides a clock to the source cells 202(*a*)-202(*d*) through one of the inputs of the AND gates 204(*a*)-204(*d*). The enable lines 203(*a*)-203(*d*) are connected to the other input of the AND gates 204(*a*)-204(*d*). The enable lines 203(*a*)-203(*d*) are enabled based on the line information and respective capacitors are switched on resulting in the LO supply current of the respective source cell to be available at the output. For example, if the enable lines 203(*a*)-203(*d*) are provided with the line information 0000, none of the source cells are active and hence, the cumulative output 208 obtained is zero.

Figure 3A:
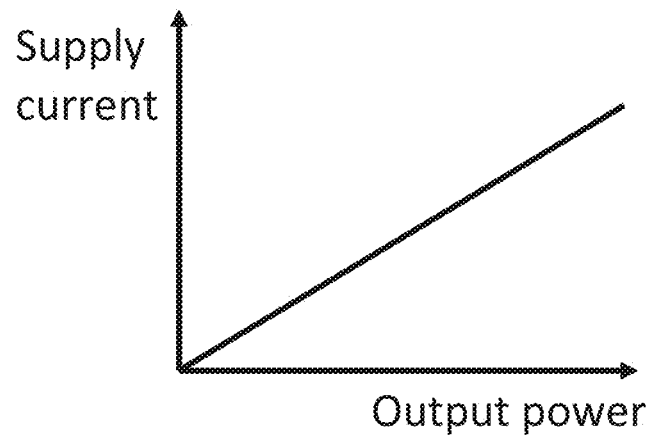
FIG. 3A-3B illustrate the relationship between the supply current and the output power generated.
Figure 3B:
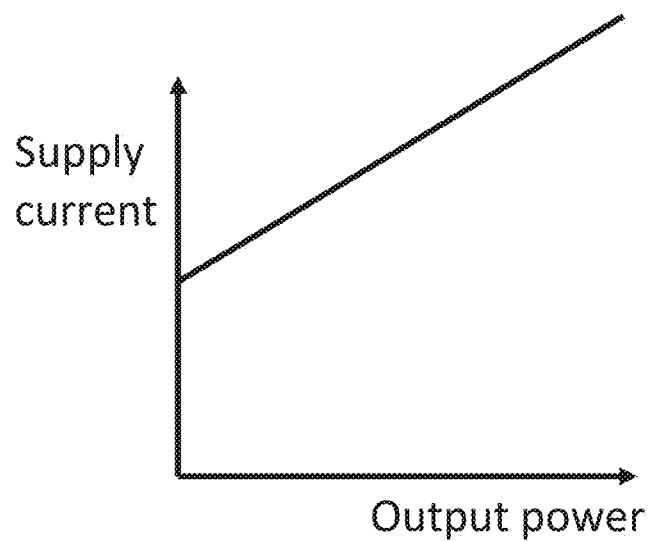

FIG. 3A illustrates the how the supply current changes with respect to the output power generated. In FIG. 3A, the x-axis denotes the output power generated and the y-axis denotes the supply current provided. For every additional switched capacitor, the output power is increased by a small amount. Therefore, the supply current is linearly increasing when the output power is increased. In addition to this power, constant power is dissipated by the synchronizing stages in the decoders. This constant power is also determined by the distribution of the LO clock. This is illustrated in FIG. 3B. The power dissipated by the digital to analog converter circuit is very high and hence results in higher power consumption. Hence, it is advantageous to bring down the power dissipation by the digital to analog converter circuits.

In order to bring down the power dissipation of the digital to analog converter circuit 100, the LO distribution is gated. That is, the control circuit 107 is configured to supply a source signal to one or more source cells of the plurality of columns based on the column information provided by the column decoder 105. Hence, only the active columns in the array of source cells are provided with the LO supply current, whereas for the non-active columns, the LO supply current is not provided.

Figure 4:
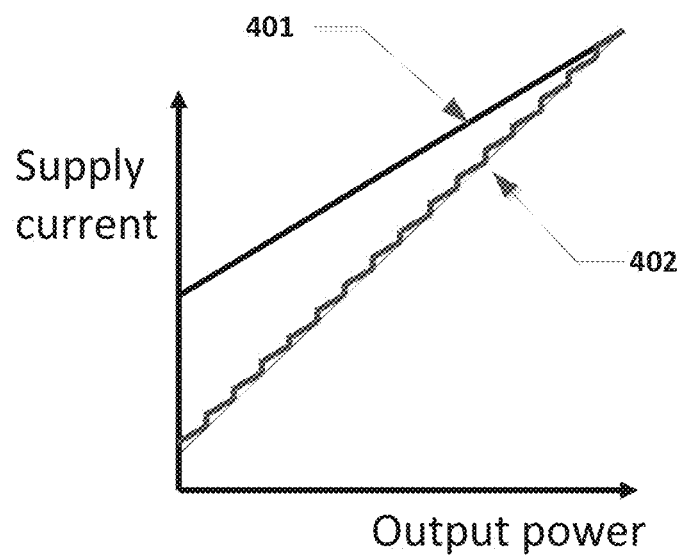
FIG. 4 illustrates the reduction in the supply current with respect to the output power generated.

FIG. 4 illustrates the change in the output power generated with respect to the supply current provided after the reduction in power dissipation. The element 401 shows the relationship between the output power generated and the supply current provided when the LO distribution is not gated. The element 402 shows the relationship between the output power generated and the supply current provided when the LO distribution is gated. The element 402 has a significantly lower supply current at the lower levels of the output power, hence achieving efficiency in power consumption.

However, the element 402 illustrates that the supply current generated is not linearly increasing with respect to the output power generated. This is because of the switching of the LO clock to provide the supply current. The non-linearity in the supply current results in the non-linearity in the supply voltage. The supply voltage is directly mixed with the RF signal and hence the noise generated is shaped like a quantized Digital to Analog Converter.

Figure 5:
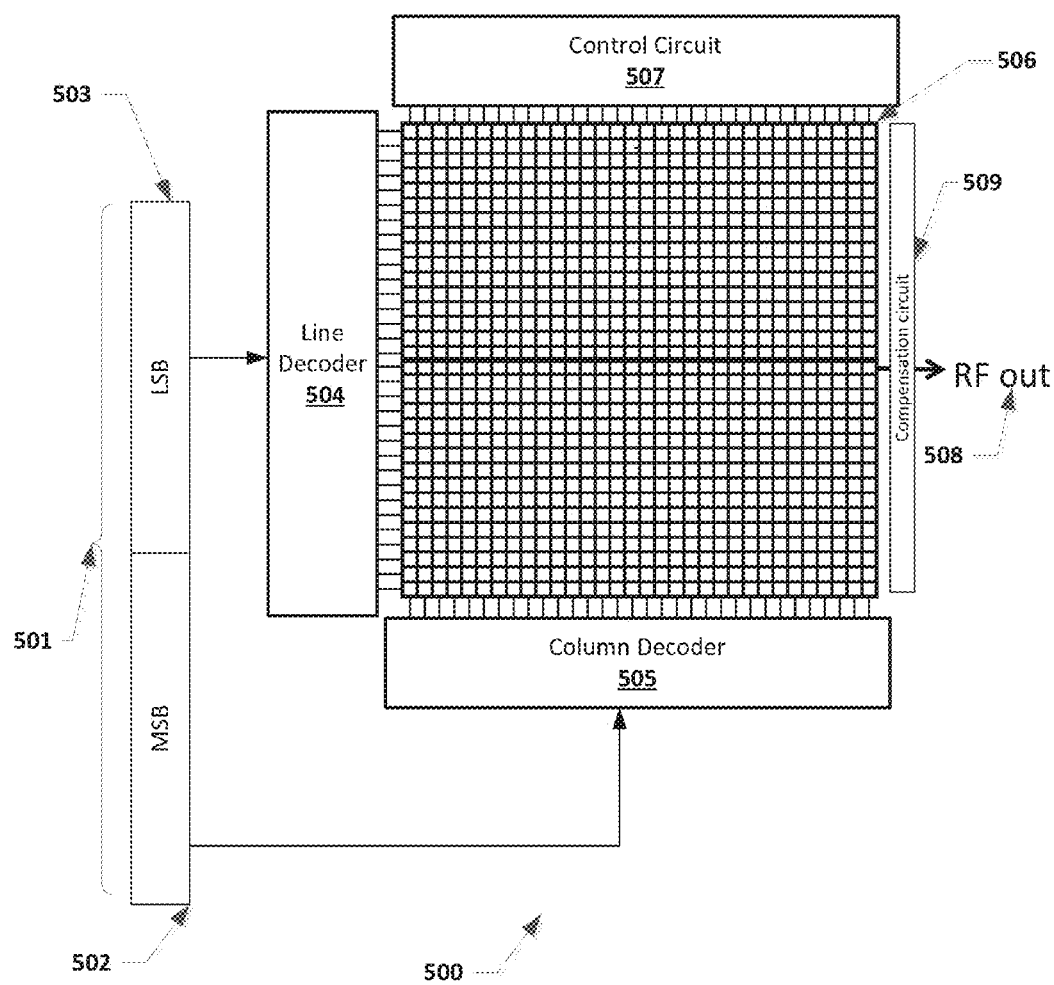
FIG. 5 illustrates a DAC system used to linearize the supply current.

In order to reduce this quantization noise, a compensation circuit is implemented. FIG. 5 illustrates an implementation of the compensation circuit in a Digital to Analog converter system. The DAC system 500 is configured to convert a digital input signal 501 to an analog output signal 508. The digital input signal 501 comprises a plurality of Least Significant Bits (LSBs) 503 and a plurality of Most Significant Bits (MSBs) 502. The DAC system 500 further comprises a line decoder 504, a column decoder 505, one or more source cells 506 and a control circuit 507.

The line decoder 504 is configured to receive the plurality of LSBs 503 of the digital input signal 501 and configured to generate a line information based thereon. The column decoder 505 is configured to receive the plurality of MSBs 504 of the digital input signal 501 and configured to generate a column information based thereon. The one or more source cells 106 are arranged in a plurality of rows and a plurality of columns. The one or more source cells are configured to be selectively activated and consequently generate an individual output signal based on the line information and the column information generated by the line decoder 504 and the column decoder 505 respectively.

The DAC system 500 further comprises a compensation circuit 509. The compensation circuit 500 is configured to linearize the source signal by generating a current signal. In some embodiments, the compensation circuit is an additional DAC circuit which comprises a LO and a plurality of source cells. Each of the source cells further comprise capacitances which are switched based on the line information from the line decoder and hence generate the current signal required to linearize the supply current.

Figure 6:
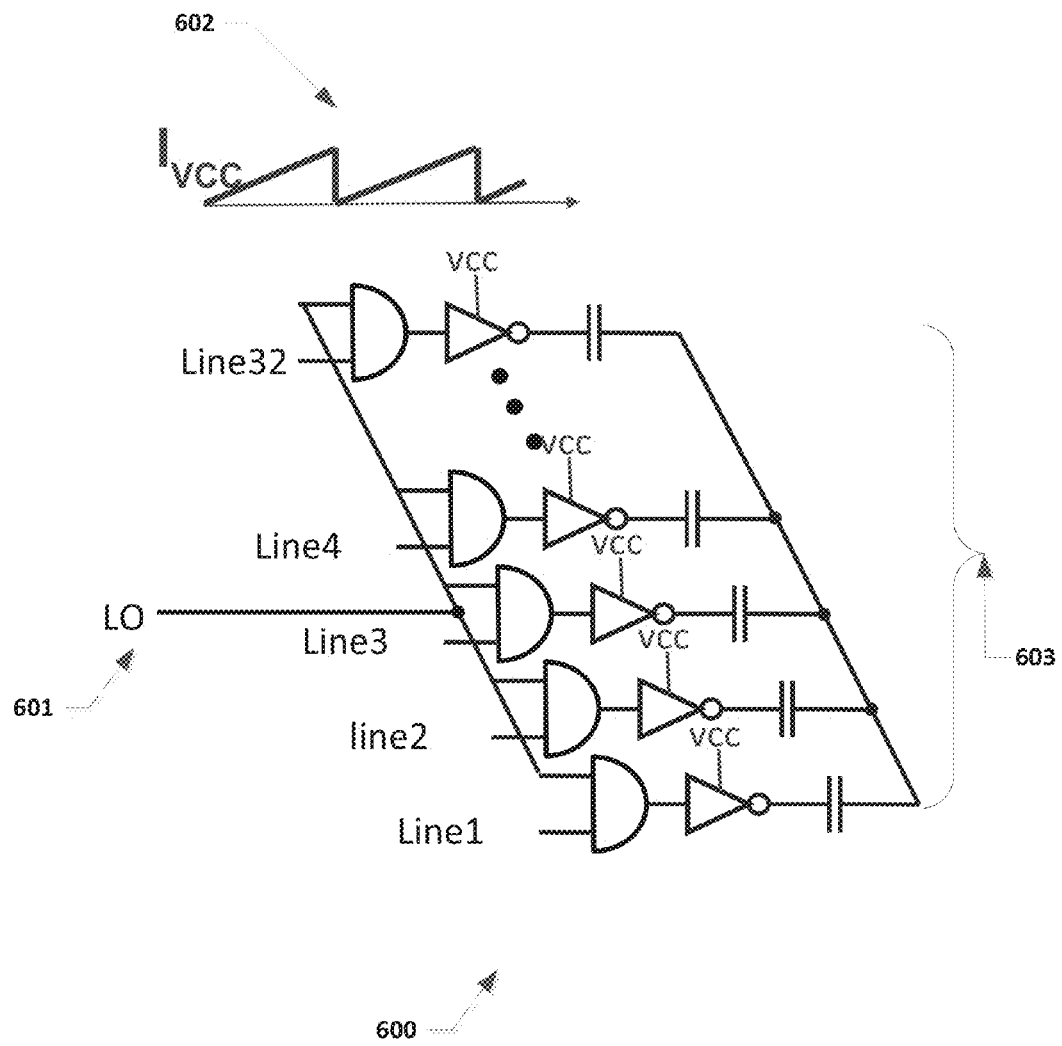
FIG. 6 illustrates an embodiment of the compensation circuit.

FIG. 6 illustrates an embodiment of the compensation circuit. The compensation circuit 600 comprises a plurality of source cells 603 and a LO 601. Each of the source cells 603 comprises an AND gate, an inverter and a capacitor. The line information is fed to the lines Line1-Line32. The respective source cells are activated by switching the respective capacitances based on the line information from the line decoder. The current signal generated by a source cell when enabled is as shown by the element 602. The current signal generated by the compensation circuit 600 does not contribute to the RF analog output signal 509. The current signal generated by the compensation circuit linearizes the supply current and does not affect the final RF analog output signal 509 with respect to the RF digital input signal 501.

Figure 7:
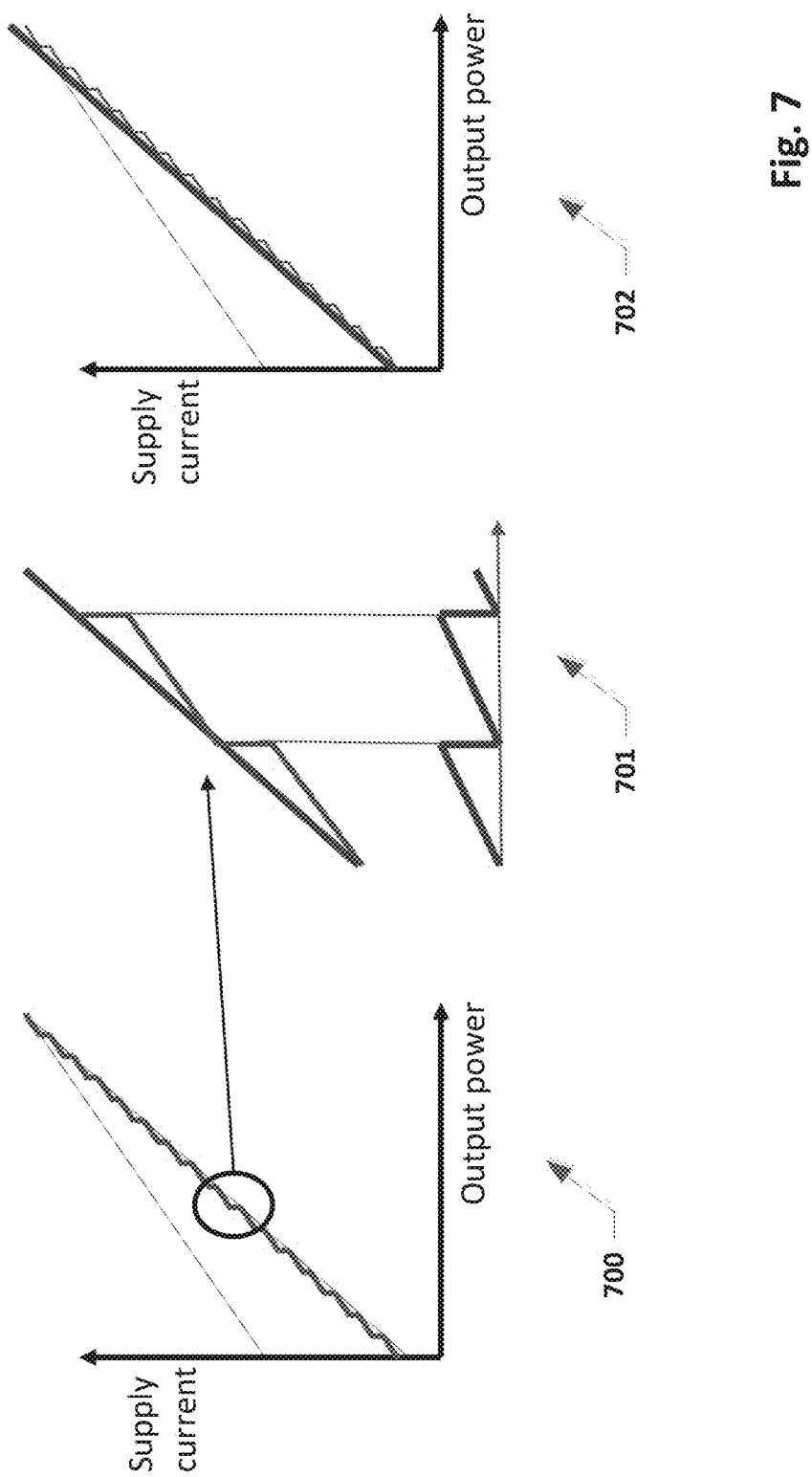
FIG. 7 illustrates the linearized supply current caused by the compensation circuit.

FIG. 7 illustrates the improvement in linearity by adding a compensation circuit 509 to the DAC circuit 100. As appreciated above, element 700 shows the reduction of the supply current with respect to the output power generated. However, the element 700 has a 5 bit quantization noise. In order to linearize the supply current, the compensation circuit 509 generates a current signal based on the line information. Element 701 shows the current signal generated by the compensation circuit 509 using the line information. As a result, a linearized supply current is obtained. Element 702 of FIG. 7 is the linearized supply current with respect to the output power generated. The supply current is now linearized and hence the power consumption is linearized to a 10 bit level. The compensation circuit 509 does not contribute to the RF analog output, but only consumes power. In another embodiment, the binary information which serves as an input to the decoder can be used to linearize the power consumption instead of the line information, which is the decoded thermometer bits. However, the granularity of linearization is better if the line information is used instead of the binary information.

Although the invention has been illustrated and described with respect to one or more implementations, alterations and/or modifications may be made to the illustrated examples without departing from the spirit and scope of the appended claims.

One or more of the operations described can constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a digital to analog converter circuit to convert a digital input signal to an analog output signal, wherein the digital input signal comprises a plurality of Least Significant Bits (LSBs) and a plurality of Most Significant bits (MSBs), the digital to analog converter circuit comprising: a line decoder configured to receive the plurality of LSBs of the digital input signal and configured to generate a line information based thereon; a column decoder configured to receive the plurality of MSBs of the digital input signal and configured to generate a column information based thereon; one or more source cells arranged in a plurality of rows and a plurality of columns, wherein the one or more source cells are configured to be selectively activated and consequently generate an individual output signal based on the line information and the column information respectively; and a control circuit configured to supply a source signal to the one or more source cells of the plurality of columns based on the column information.

Example 2 is a digital to analog converter circuit including subject matter of example 1, including or omitting elements, further comprising one or more Local Oscillator (LO) lines coupled between a LO and the plurality of columns.

Example 3 is a digital to analog converter circuit including subject matter of example 2, including or omitting elements, wherein the one or more LO lines are activated based on the column information.

Example 4 is a digital to analog converter circuit including subject matter of example 1, including or omitting elements, further comprising a compensation circuit comprising one or more cells configured to linearize the source signal.

Example 5 is a digital to analog converter circuit including subject matter of example 4, including or omitting elements, wherein the compensation circuit linearizes the source signal by generating a current signal.

Example 6 is a digital to analog converter circuit including subject matter of example 5, including or omitting elements, wherein the compensation circuit comprises a plurality of capacitances.

Example 7 is a digital to analog converter circuit including subject matter of example 6, including or omitting elements, wherein the generation of the current signal is based on switching the plurality of capacitances.

Example 8 is a digital to analog converter circuit including subject matter of example 4, including or omitting elements, wherein the compensation circuit linearizes the source signal based on the line information.

Example 9 is a digital to analog converter circuit including subject matter of example 1, including or omitting elements, wherein a sum of the individual output signals generated by the one or more source cells provide the analog output signal.

Example 10 is a digital to analog converter circuit including subject matter of example 1, including or omitting elements, wherein the one or more source cells comprises a plurality of capacitances.

Example 11 is a digital to analog converter circuit including subject matter of example 10, including or omitting elements, wherein the individual output signal is obtained by switching the plurality of capacitances based on the line information and the column information.

Example 12 is a digital to analog converter system to convert a digital input signal to an analog output signal, wherein the digital input signal comprises a plurality of Least Significant Bits (LSBs) and a plurality of Most Significant bits (MSBs), the digital to analog converter system comprising: a line decoder component configured to receive the plurality of LSBs of the digital input signal and configured to generate a line information based thereon; a column decoder component configured to receive the plurality of MSBs of the digital input signal and configured to generate a column information based thereon; one or more source cells arranged in a plurality of rows and a plurality of columns, wherein the one or more source cells are configured to be selectively activated and consequently generate an individual output signal based on the line information and the column information respectively; a control circuit component configured to supply a source signal to the one or more source cells of the plurality of columns based on the column information; and a compensation circuit component comprising one or more cells configured to linearize the source signal.

Example 13 is a digital to analog converter system including subject matter of example 12, including or omitting elements, wherein the compensation circuit component linearizes the source signal by generating a current signal.

Example 14 is a digital to analog converter system including subject matter of example 13, including or omitting elements, wherein the compensation circuit component comprises a plurality of capacitances.

Example 15 is a digital to analog converter system including subject matter of example 14, including or omitting elements, wherein the generation of the current signal is based on switching the plurality of capacitances.

Example 16 is a digital to analog converter system including subject matter of examples 12-15, including or omitting elements, wherein the compensation circuit component linearizes the source signal based on the line information.

Example 17 is a method improve linearity in a digital to analog converter circuit, wherein the digital to analog converter circuit converts a digital input signal to an analog output signal, wherein the digital input signal comprises a plurality of Least Significant Bits (LSBs) and a plurality of Most Significant Bits (MSBs), the method comprising: receiving, by a line decoder, the plurality of LSBs of the digital input signal and generate a line information; receiving, by a column decoder, the plurality of MSBs of the digital input signal and generate a column information; selectively activating one or more source cells arranged in a plurality of rows and a plurality of columns; generate an individual output signal based on the line information and the column information; supply a source signal, by a control circuit, to one or more source cells of the plurality of columns based on the column information; and linearize, the compensation circuit, by a source signal.

Example 18 is a method including subject matter of example 17, including or omitting elements, wherein the source signal is linearized by generating a current signal.

Example 19 is a method including subject matter of example 18, including or omitting elements, wherein generating the source signal is based on switching a plurality of capacitances.

Example 20 is a method including subject matter of examples 17-18, including or omitting elements, wherein linearizing the source signal is based on the line information.

What is claimed is:

1. A digital to analog converter circuit to convert a digital input signal to an analog output signal, wherein the digital input signal comprises a plurality of Least Significant Bits (LSBs) and a plurality of Most Significant bits (MSBs), the digital to analog converter circuit comprising:
    a line decoder configured to receive the plurality of LSBs of the digital input signal and configured to generate a line information based thereon;
    a column decoder configured to receive the plurality of MSBs of the digital input signal and configured to generate a column information based thereon;
    one or more source cells arranged in a plurality of rows and a plurality of columns, wherein the one or more source cells are configured to be selectively activated and consequently generate an individual output signal based on the line information and the column information respectively;
    a control circuit configured to supply a source signal to selectively energize one or more source cells of the plurality of columns based on the column information; and
    a compensation circuit comprising one or more cells configured to linearize the source signal.

2. The digital to analog converter circuit of claim 1, further comprising
    one or more Local Oscillator (LO) lines coupled between a LO and the plurality of columns.

3. The digital to analog converter circuit of claim 2, wherein the one or more LO lines are activated based on the column information.

4. The digital to analog converter circuit of claim 1, wherein the compensation circuit linearizes the source signal by generating a current signal.

5. The digital to analog converter circuit of claim 4, wherein the compensation circuit comprises a plurality of capacitances.

6. The digital to analog converter circuit of claim 5, wherein the generation of the current signal is based on switching the plurality of capacitances.

7. The digital to analog converter circuit of claim 1, wherein the compensation circuit linearizes the source signal based on the line information.

8. The digital to analog converter circuit of claim 1, wherein a sum of the individual output signals generated by the one or more source cells provide the analog output signal.

9. The digital to analog converter circuit of claim 1, wherein the one or more source cells comprises a plurality of capacitances.

10. The digital to analog converter circuit of claim 9,
wherein the individual output signal is obtained by switching the plurality of capacitances based on the line information and the column information.

11. A digital to analog converter system to convert a digital input signal to an analog output signal, wherein the digital input signal comprises a plurality of Least Significant Bits (LSBs) and a plurality of Most Significant bits (MSBs), the digital to analog converter system comprising:
a line decoder component configured to receive the plurality of LSBs of the digital input signal and configured to generate a line information based thereon;
a column decoder component configured to receive the plurality of MSBs of the digital input signal and configured to generate a column information based thereon;
one or more source cells arranged in a plurality of rows and a plurality of columns, wherein the one or more source cells are configured to be selectively activated and consequently generate an individual output signal based on the line information and the column information respectively;
a control circuit component configured to supply a source signal to the one or more source cells of the plurality of columns based on the column information; and
a compensation circuit component comprising one or more cells configured to linearize the source signal.

12. The digital to analog converter system of claim 11, wherein the compensation circuit component linearizes the source signal by generating a current signal.

13. The digital to analog converter system of claim 12, wherein the compensation circuit component comprises a plurality of capacitances.

14. The digital to analog converter system of claim 13, wherein the generation of the current signal is based on switching the plurality of capacitances.

15. The digital to analog converter system of claim 11, wherein the compensation circuit component linearizes the source signal based on the line information.

16. A method to improve linearity in a digital to analog converter circuit, wherein the digital to analog converter circuit converts a digital input signal to an analog output signal, wherein the digital input signal comprises a plurality of Least Significant Bits (LSBs) and a plurality of Most Significant Bits (MSBs), the method comprising:
receiving, by a line decoder, the plurality of LSBs of the digital input signal and generate a line information;
receiving, by a column decoder, the plurality of MSBs of the digital input signal and generate a column information;
selectively activating one or more source cells arranged in a plurality of rows and a plurality of columns;
generating an individual output signal based on the line information and the column information;
supplying a source signal, by a control circuit, to one or more source cells of the plurality of columns based on the column information; and
linearizing the source signal, by a compensation circuit component comprising one or more cells.

17. The method of claim 16,
wherein the source signal is linearized by generating a current signal.

18. The method of claim 17,
wherein generating the source signal is based on switching a plurality of capacitances.

19. The method of claim 16,
wherein linearizing the source signal is based on the line information.

* * * * *